(12) United States Patent
Park et al.

(10) Patent No.: US 7,357,878 B2
(45) Date of Patent: Apr. 15, 2008

(54) ETCHANT, AND METHOD FOR FABRICATING A THIN FILM TRANSISTOR SUBTRATE INCLUDING CONDUCTIVE WIRES USING THE ETCHANT AND THE RESULTING STRUCTURE

(75) Inventors: Hong-sick Park, Suwon-si (KR);
Shi-yul Kim, Yongin-si (KR);
Jong-hyun Choung, Suwon-si (KR);
Won-suk Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 11/351,015

(22) Filed: Feb. 9, 2006

(65) Prior Publication Data

US 2006/0278606 A1 Dec. 14, 2006

(30) Foreign Application Priority Data

Jun. 9, 2005 (KR) .................... 10-2005-0049453

(51) Int. Cl.
*C23F 1/00* (2006.01)

(52) U.S. Cl. ................. 216/91; 216/101; 216/103; 438/754

(58) Field of Classification Search ............... 438/754; 216/91, 101, 103
See application file for complete search history.

(56) References Cited

U.S. PATENT DOCUMENTS

2002/0086244 A1* 7/2002 Hanson ............... 430/319

2003/0107023 A1* 6/2003 Chae et al. ............ 252/79.1
2003/0168431 A1* 9/2003 Lee et al. ............... 216/86
2004/0072444 A1 4/2004 Park et al.
2004/0262569 A1* 12/2004 Cho et al. ............. 252/79.1
2005/0040139 A1* 2/2005 Gonzalez et al. .......... 216/83

FOREIGN PATENT DOCUMENTS

JP  2002-231706  8/2002
KR  10-2003-0034402  5/2003

OTHER PUBLICATIONS

Chemblink, http://www.chemblink.com/products/631-61-8.htm; Ammonium acetate; no date available.*
Patent Abstracts of Japan, Publication No. 2002-231706, Aug. 16, 2002, 1 p.
Korea Patent Abstracts, Publication No. 10-2003-0034402, May 9, 2003, 1 p.

* cited by examiner

*Primary Examiner*—Binh X. Tran
(74) *Attorney, Agent, or Firm*—MacPherson Kwok Chen & Heid LLP

(57) ABSTRACT

Provided are an etchant, a method for fabricating a wire using the etchant, and a method for fabricating a thin film transistor (TFT) substrate using the etchant. The etchant includes a material having the formula 1, ammonium acetic acid, and the remainder of deionized water, wherein the formula 1 is expressed by:

$$M(OH)_X L_Y \quad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

20 Claims, 14 Drawing Sheets

ETCHANT, AND METHOD FOR FABRICATING A THIN FILM TRANSISTOR SUBTRATE INCLUDING CONDUCTIVE WIRES USING THE ETCHANT AND THE RESULTING STRUCTURE

This application claims priority from Korean Patent Application No. 10-2005-0049453 filed on Jun. 9, 2005, in the Korean Intellectual Property Office, the disclosure of which is incorporated herein by reference in its entirety.

BACKGROUND OF THE INVENTION

1. Field of the Invention

The present invention relates to an etchant, and more particularly, to an etchant for an Ag wire, a method for fabricating an Ag wire using the etchant, and a method for fabricating a thin film transistor (TFT) substrate using the etchant.

2. Description of the Related Art

A liquid crystal display ("LCD"), which is one of the most widely used flat panel displays, includes two panels having a plurality of electrodes and a liquid crystal layer interposed therebetween. The LCD applies voltages to the electrodes to rearrange the liquid crystal molecules, thereby adjusting the transmitted amount of incident light.

An LCD including electrodes on respective panels and thin film transistors ("TFTs") switching the voltages applied to the electrodes is mostly used among various kinds of LCDs. The TFTs are typically provided on one of the two panels. In the LCD, a plurality of pixel electrodes are arranged in a matrix at one panel and a common electrode covers the entire surface of the other panel. An image is displayed on the LCD by applying individual voltages to the respective pixel electrodes. To apply the individual voltages, a plurality of three-terminal TFTs are connected to the respective pixel electrodes, and a plurality of gate lines transmitting signals for controlling the TFTs and a plurality of data lines transmitting voltages to be applied to the pixel electrodes are provided on the panel.

As the display area of the LCD increases, the gate lines and the data lines connected to the TFTs also grow longer, causing an increase in the resistance of a wire. To solve a signal delay problem resulting from the increase in the resistance, the gate lines and the data lines should be formed of a material having as low a resistivity as possible.

Among materials for a wire, Ag has the lowest resistivity. Ag is known to have a resistivity of about 1.59 $\mu\Omega$cm. Thus, by using gate lines and data lines formed of Ag in a practical process, the signal delay problem can be alleviated.

However, due to the poor adhesion of Ag to a lower substrate such as an insulating substrate formed of glass or a semiconductor substrate formed of intrinsic amorphous silicon or doped amorphous silicon, Ag is not easy to deposit and is likely to bring about lifting or peeling of a wire. Moreover, even when an Ag conductive layer is properly deposited on a substrate, an etchant is used to pattern the Ag conductive layer. When using a conventional etchant for patterning, Ag is over-etched or is not etched uniformly, causing lifting or peeling of a wire and degrading the side profile of the wire.

Consequently, there is a need for an etchant that improves the side profile of the wire while maintaining the adhesion of the Ag conductive layer to the substrate during a process of patterning the Ag conductive layer deposited on the substrate.

SUMMARY OF THE INVENTION

The present invention provides an etchant for an Ag wire.

The present invention also provides a method for fabricating an Ag wire using the etchant.

The present invention also provides a method for fabricating a thin film transistor (TFT) substrate using the etchant.

The above stated objects as well as other objects, features and advantages, of the present invention will become clear to those skilled in the art upon review of the following description.

According to an aspect of the present invention, there is provided an etchant including a material having the formula 1, ammonium acetic acid, and the remainder of deionized water, wherein the formula 1 is expressed by:

$$M(OH)_X L_Y \qquad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

According to another aspect of the present invention, there is provided a method for fabricating a wire, the method including forming multiple-layers including conductive oxide layers and an Ag conductive layer formed of Ag or an Ag-alloy on a substrate, and etching the multiple-layers using an etchant including a material having the formula 1, ammonium acetic acid, and the remainder of deionized water, wherein the formula 1 is expressed by:

$$M(OH)_X L_Y \qquad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

BRIEF DESCRIPTION OF THE DRAWINGS

The above and other features and advantages of the present invention will become more apparent by describing in detail preferred embodiments thereof with reference to the attached drawings in which:

FIGS. 13B through 18 are cross-sectional views illustrating processing steps taken along a line B-B' of FIG. 13A.

DETAILED DESCRIPTION OF THE INVENTION

Figure 1:
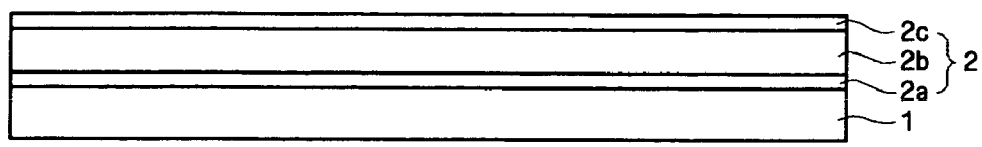
FIGS. 1 through 3 are cross-sectional views illustrating processing steps of a method for fabricating a metal wire according to an embodiment of the present invention.

Advantages and features of the present invention and methods of accomplishing the same may be understood more readily by referring to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Figure 2:
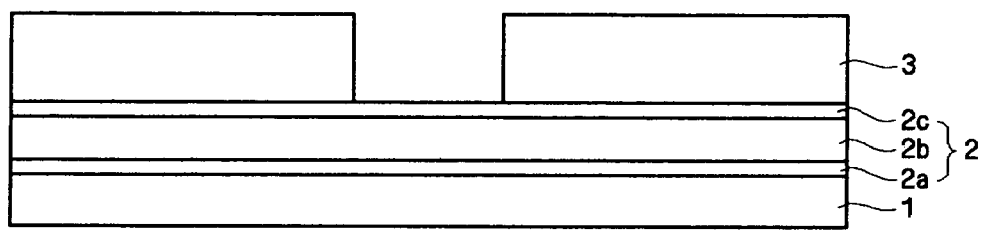
Figure 3:
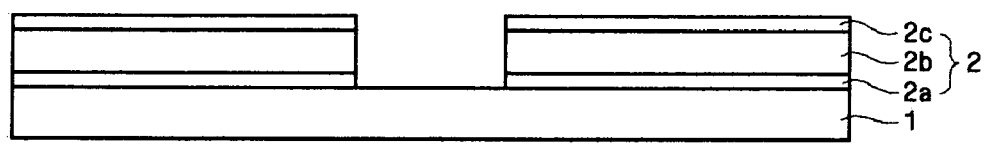

A method for fabricating a metal wire according to an embodiment of the present invention will now be described with reference to the accompanying drawing. FIGS. 1 through 3 are cross-sectional views illustrating processing steps of a method for fabricating a metal wire according to an embodiment of the present invention.

Referring to FIG. 1, a conductive layer 2a (hereinafter, referred to as a lower conductive oxide layer) formed of a conductive oxide material such as indium tin oxide (ITO) or indium zinc oxide (IZO), a conductive layer 2b (hereinafter, referred to as an Ag conductive layer) including Ag or an Ag-alloy, and a conductive layer 2c (hereinafter, referred to as an upper conductive oxide layer) formed of a conductive oxide material such as ITO or IZO are sequentially deposited on a substrate 1, thereby forming a triple-layered structure 2. Here, the substrate 1 may be, for example, an insulating substrate made of glass or a semiconductor substrate made of intrinsic amorphous silicon, or doped amorphous silicon.

The lower conductive oxide layer 2a, the Ag conductive layer 2b, and the upper conductive oxide layer 2c are formed by, for example, sputtering. Hereinafter, the sputtering method for forming the triple-layered structure 2 using ITO and Ag as targets for sputtering will be described.

First, the lower conductive oxide layer 2a is formed of ITO on the substrate 1 by applying power only to the ITO target without applying power to the Ag target. The lower conductive oxide layer 2a is formed to a thickness of about 30-300 Å. When the thickness of the lower conductive oxide layer 2a is greater than 30 Å, sufficient adhesion can be secured between the substrate 1 and the Ag conductive layer 2b by effectively preventing the substrate 1 and the Ag conductive layer 2b from partially contacting each other. It is preferable that the thickness of the lower conductive oxide layer 2a be less than 300 Å to achieve a desirable contact resistance. More preferably, the lower conductive oxide layer 2a is formed to a thickness of 50-100 Å.

Sputtering may be performed, for example, at a temperature of about 150□ or less, preferably, at room temperature. At such temperature, a conductive oxide material including ITO cannot be crystallized, i.e., can take an amorphous form. When ITO is deposited under such a condition, amorphous ITO is formed. At this time, hydrogen gas ($H_2$) or steam ($H_2O$) may be supplied. In addition, in sputtering, ITO nitride (ITON) may be formed by exposing ITO to a nitrogen supply gas such as nitrogen gas ($N_2$), ammonia ($NH_3$), or nitrous oxide ($N_2O$). ITO nitride (ITON) suppresses a sharp increase of wire resistance by preventing oxidation of Ag in a contact area between Ag and ITO.

After the power applied to the ITO target is turned off, power is applied to the Ag target to form the Ag conductive layer 2b. The Ag conductive layer 2b is formed to a thickness of about 1000-3000 Å, preferably 1500-2000 Å.

Here, the lower conductive oxide layer 2a formed of amorphous ITO is interposed between the Ag conductive layer 2b and the substrate 1. Amorphous ITO is a material with large surface roughness and includes a lot of concave and convex portions on its surface. With the concave and convex portions, contact areas between the substrate 1 and the lower conductive oxide layer 2a and between the lower conductive oxide layer 2a and the Ag conductive layer 2b increase, thereby improving adhesion.

After the power applied to the Ag target is turned off, power is applied to the ITO target to form the upper conductive oxide layer 2c. Since the upper conductive oxide layer 2c is formed of amorphous ITO, adhesion between a layer to be formed on the triple-layered structure 2, e.g., an insulating layer, and the Ag conductive layer 2b increases. The upper conductive oxide layer 2c also prevents Ag from diffusing from the Ag conductive layer 2b to the upper direction of the triple-layered structure 2. The upper conductive oxide layer 2c may be formed to a thickness of about 30-300 Å, preferably 50-100 Å, like the lower conductive oxide layer 2a.

Next, as shown in FIG. 2, a photoresist layer is coated on the triple-layered structure 2 and is then exposed and developed, thereby forming a photoresist pattern 3 that defines a wire pattern.

As shown in FIG. 3, the triple-layered structure 2 is etched using the photoresist pattern 3 as an etching mask and the photoresist pattern 3 is then removed, thereby forming the triple-layered wire 2. The etching with respect to the triple-layered structure 2 may be wet etching using an etchant.

Here, the etchant according to an embodiment of the present invention, used for wet etching, includes a material having the formula 1, ammonium acetic acid, and the remainder of deionized water, wherein the formula 1 is expressed by:

$$M(OH)_X L_Y \qquad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

The material represented by Formula 1 functions as a stabilizer that enhances the stability of the etchant and improves the profile of the etched material by increasing etching uniformity. An amount of the material contained in the etchant may be, for example, 0.1-5 wt % with respect to the total amount of the etchant. An amount of the material in the etchant greater than 0.1 wt % gives the desired uniformity with the understanding that the desired etching uniformity and etchant stability is achieved for an amount of the material in the etchant up to 5 wt %. It is preferable that the amount of the material in the etchant be between 0.5-2 wt %.

Ammonium acetic acid is used in a trivial amount in the etchant together with the material represented by Formula 1 to improve both etching uniformity and the resulting etched profile. The amount of ammonium acetic acid may be, for example, within a range of 0.001-0.1 wt % with respect to the total amount of the etchant. While ammonium acetic acid in the etchant within this range gives the desired improvement in etch uniformity and etching profile, it is preferable that the amount of ammonium acetic acid be in a range of 0.002-0.005 wt %.

However, the amount of the material represented by Formula 1 and the amount of ammonium acetic acid are not limited to the ranges stated above, but may vary with the etching target, etching temperature, etching time, etching method, and the type of additive, all of which fall within the scope of the present invention.

The etchant according to an embodiment of the present invention may further include phosphoric acid, nitric acid, and acetic acid.

Here, phosphoric acid increases etching speed. The amount of phosphoric acid may be in a range of 50-80 wt % with respect to a total amount of the etchant. When the amount of phosphoric acid is greater than 50 wt %, sufficiently high etching speed can be secured. When the amount of phosphoric acid is greater than 80 wt %, a difficulty in spraying the etchant due to an increase in viscosity is observed. This difficulty can be avoided by limiting the amount of phosphoric acid to less than 80 wt %. It is preferable that the amount of phosphoric acid be in a range of 60-70 wt %.

Nitric acid improves etching speed. The amount of nitric acid may be in a range of 0.1-10 wt % with respect to the total amount of the etchant. When the amount of nitric acid is greater than 0.1 wt %, etching speed sufficiently increases. When the amount of phosphoric acid is greater than 10 wt %, it is possible to damage a photoresist layer. Phosphoric acid less than 10 wt % in the etchant effectively prevents damage to the photoresist layer. It is preferable that the amount of nitric acid be in a range of 0.5-5 wt %.

Acetic acid improves wettability with respect to a photoresist layer. The amount of acetic acid may be in a range of 1-25 wt %. When the amount of acetic acid is greater than 1 wt %, it is possible to effectively prevent etching from being performed incompletely due to degradation in wettability of the etchant with respect to the photoresist layer. When the amount of acetic acid is less than 25 wt %, it is possible to prevent the life span of the etchant from being shortened due to a significant change in composition of the etchant, by suppressing evaporation of acetic acid. It is preferable that the amount of acetic acid be in a range of 2-10 wt %.

Moreover, in order to improve the characteristic of the etchant, an additive such as a surfactant may be further included in the etchant. The surfactant may be an anionic surfactant, a cationic surfactant, or a non-ion surfactant. The amount of the surfactant contained in the etchant may be in a range of 0.001-1 wt %, preferably 0.005-0.1 wt %.

The remainder of the etchant may include deionized water in addition to the material.

The etchant may be fabricated by, but not limited to, mixing the material represented by Formula 1, ammonium acetic acid, phosphoric acid, nitric acid, and acetic acid in deionized water or by mixing a previously fabricated solution of materials in ultra-super water. In addition, there is no specific limit in the mixing order.

When there are microspheres in the etchant, fine patterns may not be properly etched. Thus, before the etchant is used it is desirable to remove the microspheres from the etchant so that the number of microspheres with a diameter of 0.5 µm or more can be less than 1000/mL. The microspheres may be removed by filtering the etchant using a fine filter. The filtering may be one-time filtering, preferably circulating filtering in which microspheres are removed at high speeds.

The etchant has a high etch selectivity to the triple-layered structure 2, maintains adhesion of the triple-layered structure 2 to the substrate 1, and allows the side profile of the triple layer wire 2 to have a good tapered acute angle.

Hereinafter, a process of etching the triple-layered structure 2 using the etchant according to an embodiment of the present invention will be described in detail.

Etching of the triple-layered structure 2 may be individually performed on each of the upper conductive oxide layer 2c, the Ag conductive layer 2b, and the lower conductive oxide layer 2a. However, since ITO included in the upper conductive oxide layer 2c and the lower conductive oxide layer 2a and Ag or an Ag-alloy included in the Ag conductive layer 2b have a similar etching speed, the upper conductive oxide layer 2c, the Ag conductive layer 2b, and the lower conductive oxide layer 2a may be etched in a batch manner, leading to a good side profile of the triple-layered wire 2.

Etching may be performed by spraying the etchant onto the surface of the triple-layered structure 2 in which the photoresist pattern 3 is formed. At this time, an etching temperature may be maintained at about 30-50° C. An etching time may last until a half of the time detected by an end point detector (EPD) during which the substrate 1 is exposed to the etchant additionally passes. For example, the etching time may be about 30-100 seconds.

Figure 4:
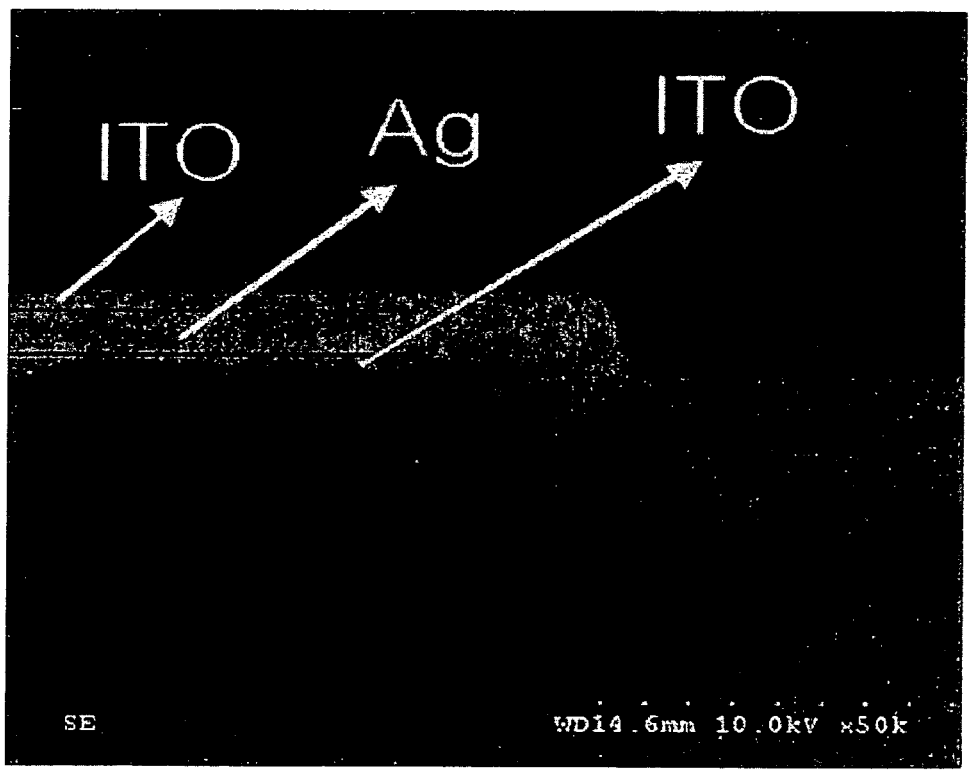
FIG. 4 is a cross-sectional picture illustrating a profile of a metal wire according to an embodiment of the present invention.

A profile of a metal wire according to an embodiment of the present invention using the etchant will be described with reference to FIG. 4. FIG. 4 is a cross-sectional picture illustrating a profile of a metal wire after a triple-layered wire including ITO, an Ag conductive layer, and ITO formed on a substrate is patterned using the etchant according to an embodiment of the present invention.

In general, the Ag conductive layer 2b included in the triple-layered structure 2 has poor adhesion to the substrate 1. To improve adhesion with respect to the substrate 1, in this embodiment of the present invention, the lower conductive oxide layer 2a and the upper conductive oxide layer 2c, formed of ITO, are formed under and on the Ag conductive layer 2b. However, when a conventional prior art etchant for conventional wire patterning is used to form the triple-layered wire 2, adhesion of the triple-layered structure 2 to the substrate 1 is degraded as the etching process progresses, causing lifting or peeling of the triple-layered wire 2. Moreover, the side profile of the triple-layered wire 2 is not uniform and may have inverse taper tilt angle.

On the other hand, when an etchant according to an embodiment of the present invention is used, since the etchant has a high etch selectivity to the triple-layered structure 2 and demonstrates superior etching uniformity, a side profile having good tapered acute angle can be formed without degrading adhesion of the triple-layered wire 2 to the substrate 1 as shown in FIG. 4.

Although a triple-layered structure including a lower conductive oxide layer, an Ag conductive layer, and an upper conductive oxide layer on a substrate is taken as an example in this embodiment of the present invention, a multi-layered conductive layer may be formed which is equivalent to the conductive oxide layer either under or on the Ag conductive layer.

The etchant and the method for fabricating an Ag wire using the etchant may also be applied to a method for fabricating a thin film transistor (TFT) substrate.

Hereinafter, a method for fabricating a TFT substrate according to an embodiment of the present invention will be described with reference to the accompanying drawings.

Figure 5A:
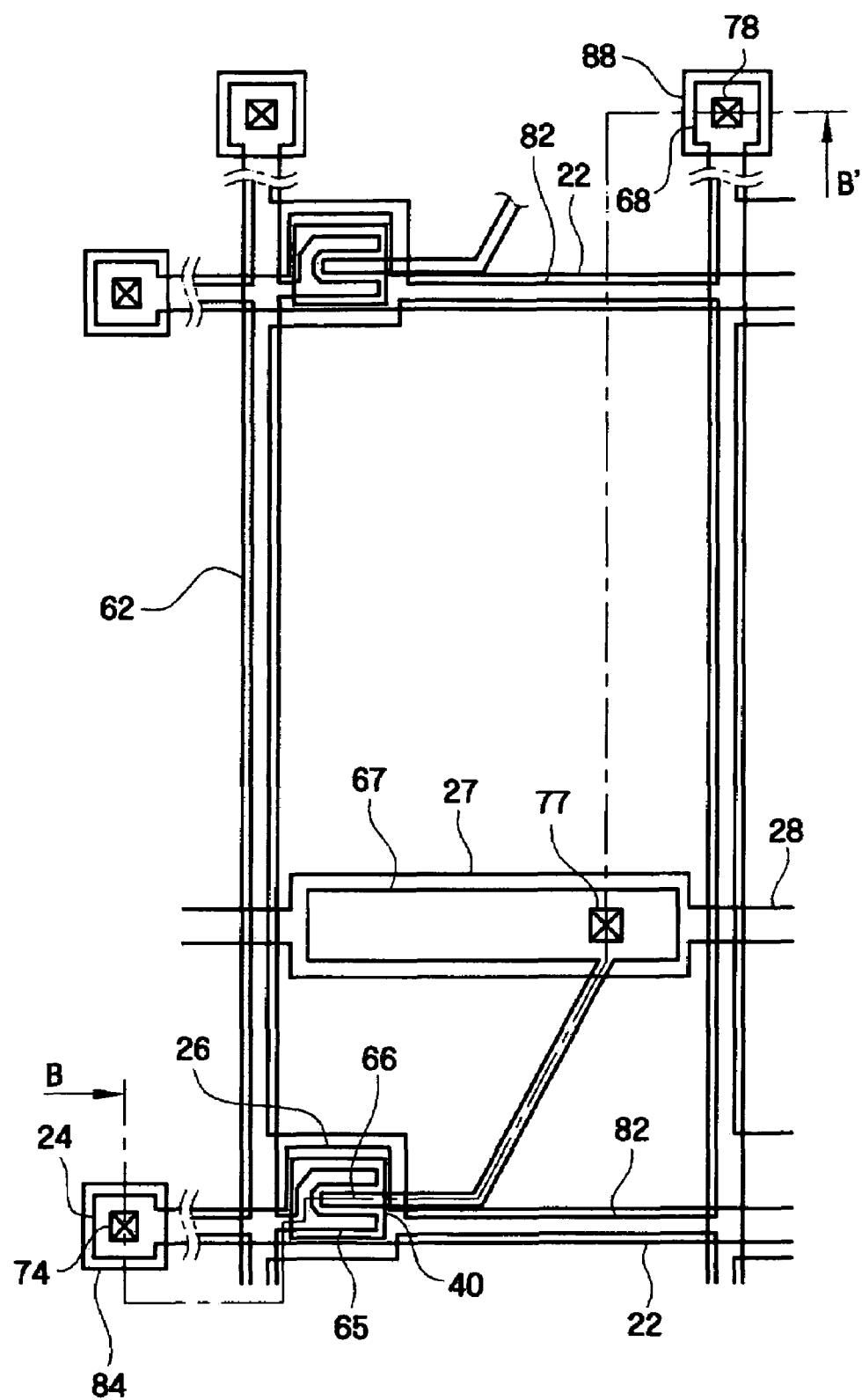
FIG. 5A is a layout of a thin film transistor (TFT) substrate fabricated using a method for fabricating a TFT substrate according to an embodiment of the present invention.

First, the structure of a TFT substrate fabricated by the method will be described with reference to FIGS. 5A and 5B. FIG. 5A is a layout of a thin film transistor (TFT) substrate fabricated using a method for fabricating a TFT substrate according to an embodiment of the present invention, and FIG. 5B is a cross-sectional view taken along a line B-B' of FIG. 5A.

Figure 5B:
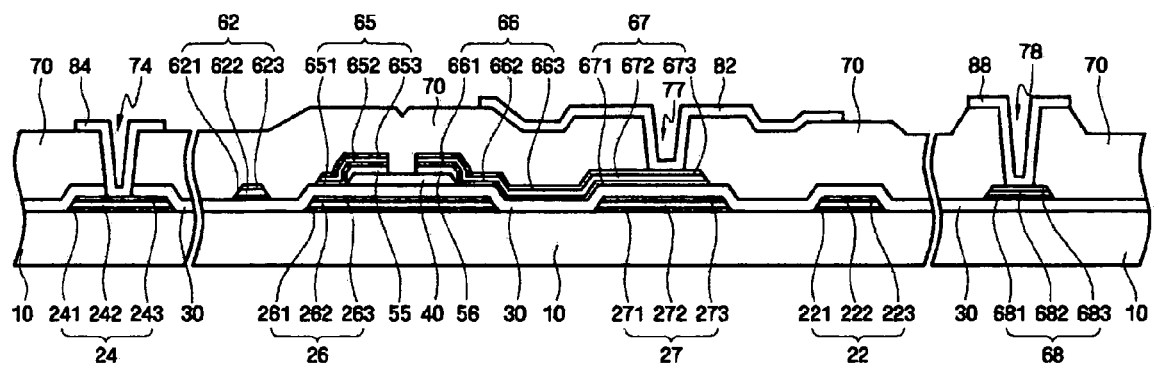
FIG. 5B is a cross-sectional view taken along a line B-B' of FIG. 5A.

A plurality of gate wires transmitting a gate signal are formed on an insulating substrate 10 (FIG. 5B). The gate wires include a gate line 22 shown as horizontally extending in FIG. 5A, a gate end 24 that is connected to the end of the gate line 22 to receive a gate signal from the outside and transmit the same to the gate line 22, a gate electrode 26 of a protruding TFT that is connected to the gate line 22, and a sustain electrode 27 and a sustain electrode line 28 formed parallel with the gate line 22. The sustain electrode line 28 horizontally extends across a pixel region and is connected to the sustain electrode 27 that is wider than the sustain electrode line 28. The sustain electrode 27 overlaps with, but is separted by dielectric 30 (not shown in FIG. 5A) from, a drain electrode extension portion 67 connected with a pixel electrode 82 to form a sustain electric condenser that improves electric charge retention capability of a pixel. The shapes and arrangements of the sustain electrode 27 and the sustain electrode line 28 may vary, and the sustain electrode 27 and the sustain electrode line 28 may not be formed if it is determined that the sustain capability generated by the overlap between the pixel electrode 82 and the gate line 22 is sufficiently high.

The gate wires are formed of triple layers 22, 24, 26, 27, and 28. The triple-layered gate line 22 includes conductive layers 221, 222, and 223. The triple layer 24 includes conductive layers 241, 242, and 243. The triple layer 26 includes conductive layers 261, 262, and 263. The triple layer 27 includes conductive layers 271, 272, and 273. The conductive layers 221, 241, 261, and 271 are formed of a conductive oxide material such as indium tin oxide (ITO) or indium zinc oxide (IZO) (hereinafter, referred to as "lower conductive oxide layers"). The conductive layers 222, 242, 262, and 272 are formed of Ag or an Ag-alloy. The conductive layers 223, 243, 263, and 273 are formed of a conductive oxide material such as ITO or IZO (hereinafter, referred to as "upper conductive oxide layers"). Although not shown in FIG. 5B, the sustain electrode line 28 also has the same triple layer structure as the triple layers 22, 24, 26, and 27. The following description of the gate wires having the triple layer structures includes the sustain electrode line 28.

The structures and functions of the triple layers 22, 24, 26, 27, and 28 are the same as those of the above-described triple layers in the method for fabricating an Ag wire according to an embodiment of the present invention.

A gate insulating layer 30 is formed of silicon nitride (SiNx) on the substrate 10 and the triple layers 22, 24, 26, 27, and 28.

A semiconductor layer 40 is formed of amorphous silicon hydride or polycrystalline silicon in the shape of an island on the gate insulating layer 30 on the gate electrode 26. Resistive contact layers 55 and 56 are formed of silicide or n+ amorphous silicon hydride in which an n-type impurity is highly doped, on the semiconductor layer 40.

Data wires are formed on the resistive contact layers 55 and 56 and the gate insulating layer 30. The data wires include a data line 62 that is shown formed vertically in FIG. 5A and intersects the gate line 22 to define a pixel, a source electrode 65 that is a branch of the data line 62 and extends onto the resistive contact layer 55, a data end 68 that is connected to an end of the data line 62 and receives an image signal from the outside, a drain electrode 66 that is separated from the source electrode 65 and is formed on the resistive contact layer 56 opposite to the source electrode 65 in view of the gate electrode 26 or a channel portion of a TFT, and a drain electrode extension portion 67 with a large area that extends from the drain electrode 66 and overlaps with, but is separated by dielectric 30 from, the sustain electrode 27.

The data wires are formed of the triple layers 62, 65, 66, 67, and 68. The triple-layered data line 62 includes conductive layers 621, 622, and 623. The triple-layered source electrode 65 includes conductive layers 651, 652, and 653. The triple-layered drain electrode 66 includes conductive layers 661, 662, and 663. The triple layer 67 includes conductive layers 671, 672, and 673. The triple layer 68 includes conductive layers 681, 682, and 683. The conductive layers 621, 651, 661, 671, and 681 are formed of a conductive oxide material such as ITO (hereinafter, referred to as "lower conductive oxide layers"). The conductive layers 622, 652, 662, 672, and 682 are formed of Ag or an Ag-alloy (hereinafter, referred to as "Ag conductive layers"). The conductive layers 623, 653, 663, 673, and 683 are formed of a conductive oxide material such as ITO (hereinafter, referred to as "upper conductive oxide layers"). Here, since the structures and functions of the lower conductive oxide layers 621, 651, 661, 671, and 681 and the upper conductive oxide layers 623, 653, 663, 673, and 683 are the same as those in the gate wires, an explanation thereof will not be given.

The source electrode 65 has at least a portion that overlaps with the semiconductor layer 40. The drain electrode 66 is located opposite the source electrode and as shown in FIG. 5B above a portion of the gate electrode 26 and has at least a portion that overlaps a portion of the semiconductor layer 40. Here, the resistive layers 55 and 56 exist between the semiconductor layer 40 and the source electrode 65 and between the semiconductor layer 40 and the drain electrode 66, respectively, to reduce contact resistances therebetween.

The drain electrode extension portion 67 overlaps the sustain electrode 27 to form sustain capability (i.e. the ability of the capacitor formed by drain electrode extension portion 67, gate insulating layer 30 and sustain electrode 27 to hold a charge) between the sustain electrode 27 and the gate insulating layer 30 on the one hand, and drain electrode extension portion 67, on the other hand. When the sustain electrode 27 is not formed, the drain electrode extension portion 67 is not formed either.

A passivation layer 70 is formed on the data wires and portions of the semiconductor layer 40 that are not covered by the data wires. The passivation layer 70 may be formed of, for example, an organic material having superior planarization properties and photosensitivity, an insulating material having a low dielectric constant formed by plasma enhanced chemical vapor deposition (PECVD), such as a-Si:C:O or a-Si:O:F, or an inorganic material such as SiNx. When the passivation layer 70 is formed of an organic material, an insulating layer (not shown) formed of silicon nitride (SiNx) or silicon oxide (SiOx) or silicon dioxide (SiO$_2$) may be further formed under the passivation layer 70 to prevent the organic material of the passivation layer 70 from contacting a portion of the semiconductor layer 40 between the source electrode 65 and the drain electrode 66.

Contact holes 77 and 78 that expose the drain electrode extension portion 67 and the data line end 68 are formed in the passivation layer 70. A contact hole 74 that exposes the gate line end 24 is formed in the passivation layer 70 and the gate insulating layer 30. A pixel electrode 82 that is electrically connected to the drain electrode 66 through the contact hole 77 and is located in a pixel is formed on the passivation layer 70. The pixel electrode 82 to which a data voltage is applied determines the arrangement of liquid crystal ("LC") microspheres of a liquid crystal layer between the pixel electrode 82 and a common electrode of an upper display panel (not shown) by generating an electric field with the common electrode.

An auxiliary gate end 84 connected to the gate end 24 through the contact hole 74 and an auxiliary data end 88 connected to the data end 68 through the contact hole 78 are formed on the passivation layer 70. The pixel electrode 82, the auxiliary gate end 84, and the auxiliary data end 88 are formed of ITO.

Hereinafter, a method for fabricating a TFT substrate according to an embodiment of the present invention will be described in detail with reference to FIGS. 5A and 5B and FIGS. 6A through 9B.

Figure 6A:
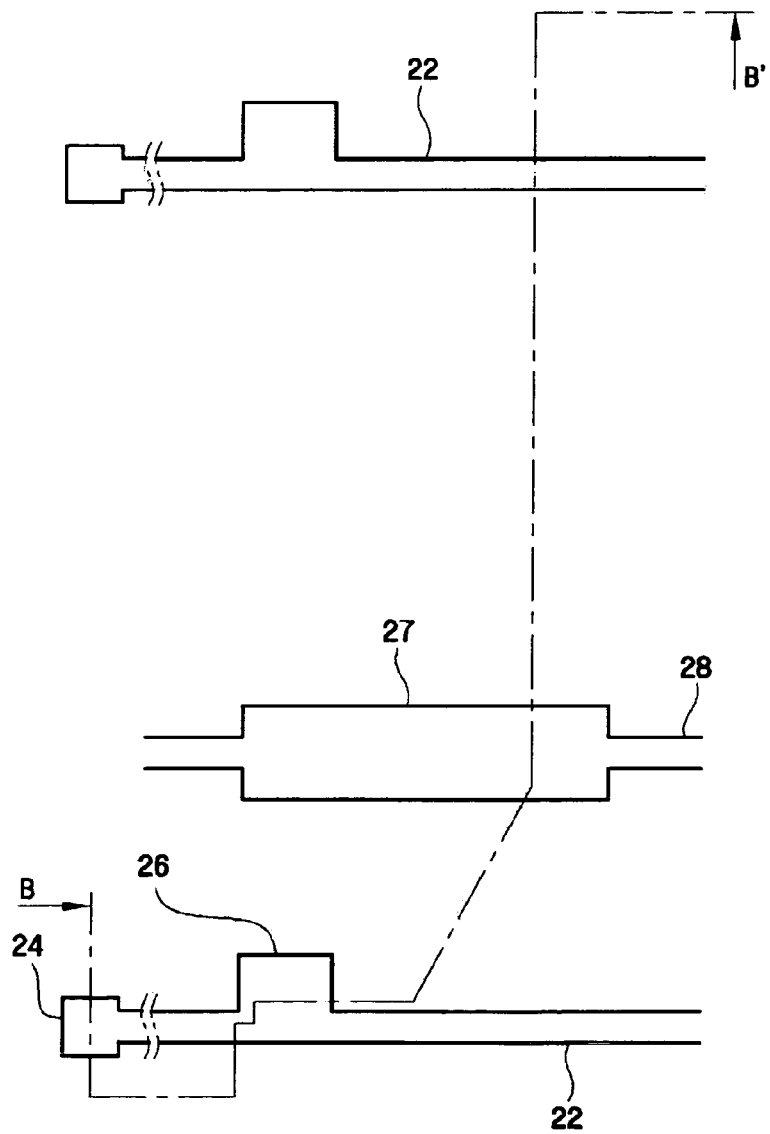
FIGS. 6A, 7A, 8A, and 9A are layouts sequentially illustrating a method for fabricating a TFT substrate according to an embodiment of the present invention.
Figure 6B:
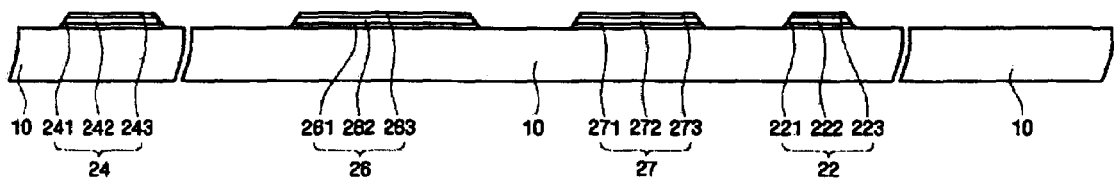
FIGS. 6B, 7B, 8B, and 9B are cross-sectional views taken along lines B-B' of FIGS. 6A, 7A, 8A, and 9A.

As shown in FIGS. 6A and 6B, a conductive layer formed of a conductive oxide material such as ITO or IZO, a conductive layer formed of Ag, and a conductive layer formed of a conductive oxide material such as ITO or IZO are sequentially deposited on the insulating substrate 10, thereby forming the gate triple-layers 22, 24, 26, 27, and 28 (not shown in FIG. 6B) including the lower conductive oxide layers 221, 241, 261, and 271, the conductive layers 222, 242, 262, and 272, and the upper conductive oxide layers 223, 243, 263, and 273.

The gate triple-layers 22, 24, 26, 27, and 28 are formed by a method of forming the triple layers in the method for fabricating an Ag wire according to an embodiment of the present invention.

Next, photolithography is performed on the gate triple-layers. The photolithography process is performed by wet etching using an etchant. The etchant is the same as that described with reference to FIGS. 1 through 4; therefore an explanation thereof will not be given.

When etching is performed using the etchant according to an embodiment of the present invention, since the etchant has a high etch selectivity to triple layers and demonstrates superior etching uniformity, a side profile having good tapered acute angle can be obtained without affecting adhesion of the triple-layered gate wires 22, 24, 26, 27, and 28 to the substrate 10.

Thus, as shown in FIGS. 6A and 6B, the gate wires including the gate line 22, the gate electrode 26, the gate end 24, the sustain electrode 27, and the sustain electrode line 28 are formed.

Figure 7A:
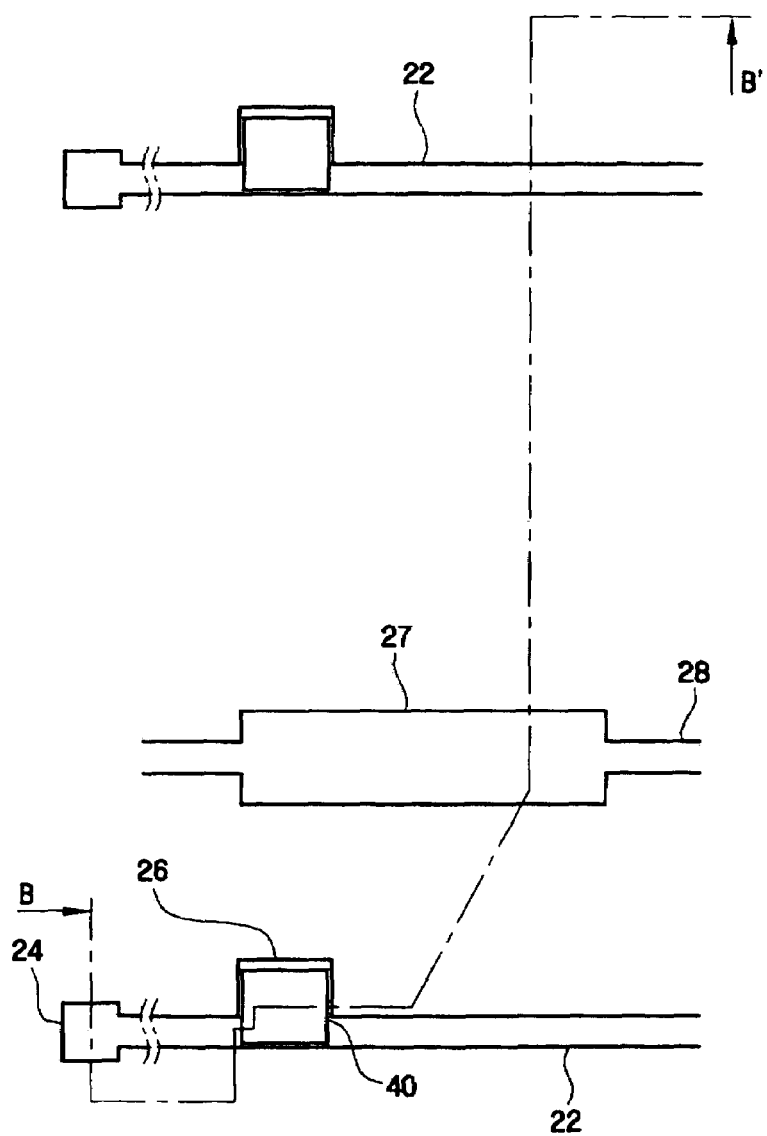
Figure 7B:
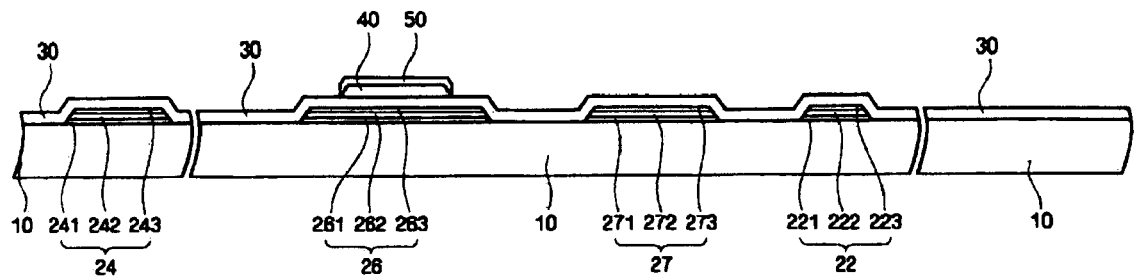

Next, as shown in FIGS. 7A and 7B, the gate insulating layer 30 (sometimes referred to herein as dielectric 30) formed of silicon nitride, an intrinsic amorphous silicon layer (to become silicon layer 40), and a doped amorphous silicon layer (to become resistive contacts 55 and 56) are continuously deposited to thicknesses of 1500-5000 Å, 500-2000 Å, and 300-600 Å, using, for example, chemical vapor deposition (CVD). Photolithography is performed on the intrinsic amorphous silicon layer 40 and the doped amorphous silicon layer to form the semiconductor layer 40 taking the shape of an island and to form the resistive contact layers 55 and 56 on the gate insulating layer 30 overlying the gate electrode 24.

Here, since the gate insulating layer 30, the intrinsic amorphous silicon layer 40, and the doped amorphous silicon layer are formed at a high temperature of about 200□ or more, amorphous ITO included in the gate wires changes into crystalline ITO. As a result, adhesion between the conductive oxide layers 221, 241, 261, 271, 223, 243, 263, and 273 and the Ag conductive layers 222, 242, 262, and 272 is improved.

Figure 8A:
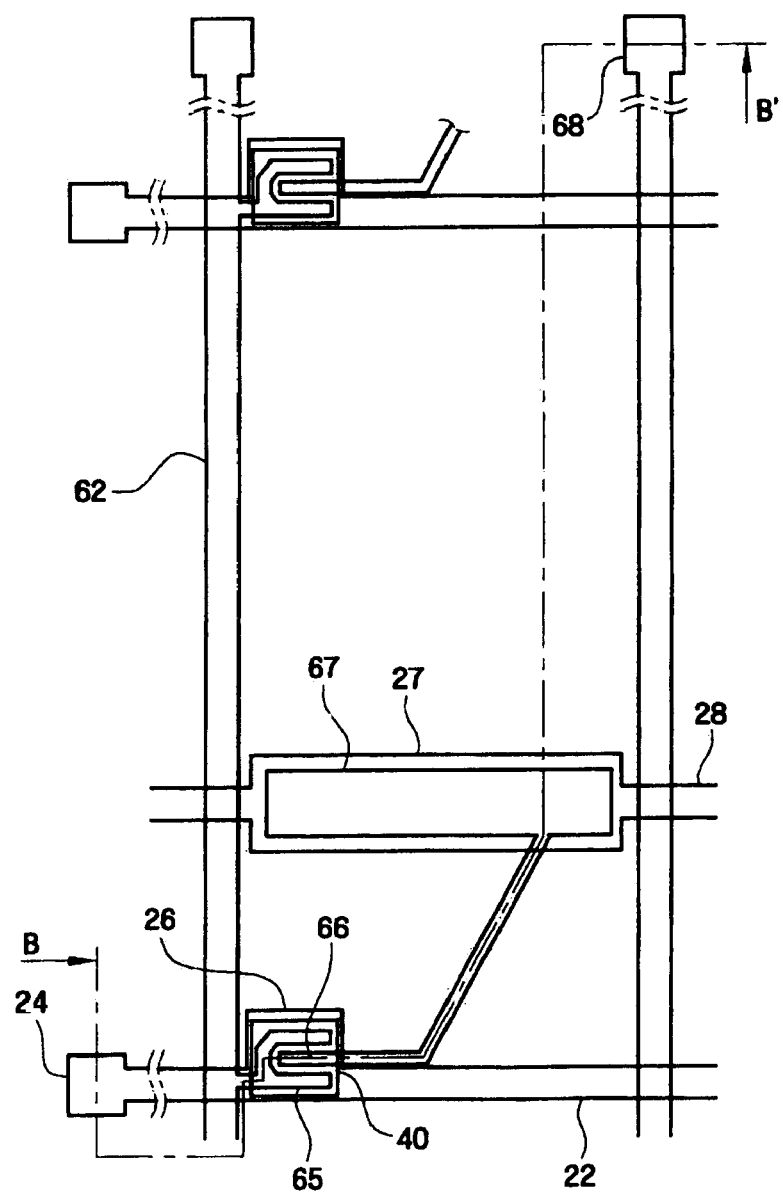
Figure 8B:
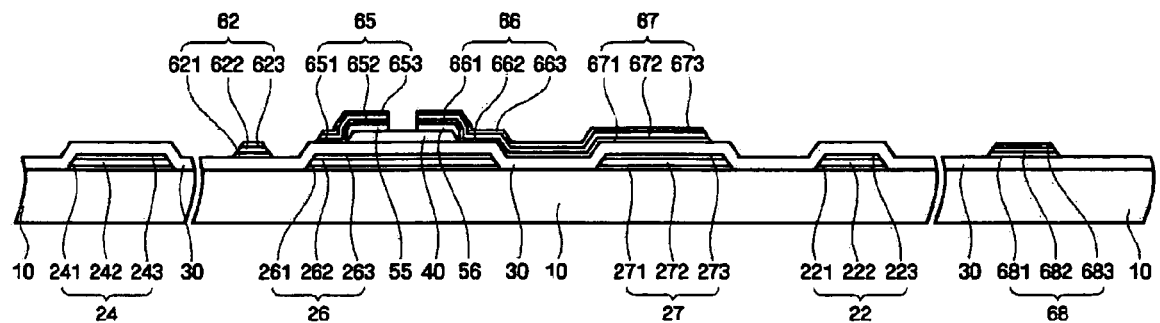

Next, as shown in FIGS. 8A and 8B, the data triple layers 62, 65, 66, 67, and 68 in which the lower conductive oxide layers 621, 651, 661, 671, and 681 formed of ITO, the Ag conductive layers 622, 652, 662, 672, and 682 formed of Ag or an Ag-alloy, and the upper conductive oxide layers 623, 653, 663, 673, and 683 formed of ITO are sequentially deposited on the gate insulating layer 30, the exposed portion of the semiconductor layer 40, and the resistive contact layers 55 and 56 by sputtering. Here, since a method of depositing the lower conductive oxide layers 621, 651, 661, 671, and 681, the Ag conductive layers 622, 652, 662, 672, and 682, and the upper conductive oxide layers 623, 653, 663, 673, and 683 is the same as the method if depositing the lower conductive oxide layers 221, 241, 261, and 271, the Ag conductive layers 222, 242, 262, and 272, and the upper conductive oxide layers 223, 243, 263, and 273 in the above described process of forming the gate wires, an additional repetitive explanation thereof will not be given.

Photolithography is performed on the data triple layers. The photolithography process is performed by wet etching using an etchant. The etchant is the same as that described with reference to FIGS. 1 through 4; thus a further explanation thereof will not be given.

When etching is performed using the etchant according to an embodiment of the present invention, since the etchant has a high etch selectivity to the data triple layers and demonstrates superior etching uniformity, a side profile having good tapered acute angle can be obtained without affecting adhesion of the triple-layered data wires 62, 65, 66, 67, and 68 to the gate insulating layer 30 and the resistive contact layers 55 and 56.

Thus, the data wires 62, 65, 66, 67, and 68 are formed, which include the data line 62 that intersects the gate line 22, the source electrode 65 that is connected to the data line 62 and extends onto the gate electrode 26, the data end 68 that is connected to an end of the data line 62, the drain electrode 66 that is separated from the source electrode 65 and is located in opposition to the source electrode 65 in view of the gate electrode 26, and the drain electrode extension protrusion 67 with a large area that extends from the drain electrode 66 and overlaps with, but is separated by dielectric 30 from, the sustain, electrode 27.

The data wires 62, 65, 66, 67, and 68 are separated but portions 65 and 66 thereof remain over both sides of the gate electrode 26 as shown in FIG. 5B by etching away portions of the doped amorphous silicon layer that are not covered by the data wires to, among other things, expose a portion of the semiconductor layer 40 between the resistive contact layers 55 and 56. At this time, it is desirable to perform oxygen plasma processing to stabilize the surface of the exposed portion of the semiconductor layer 40.

Figure 9A:
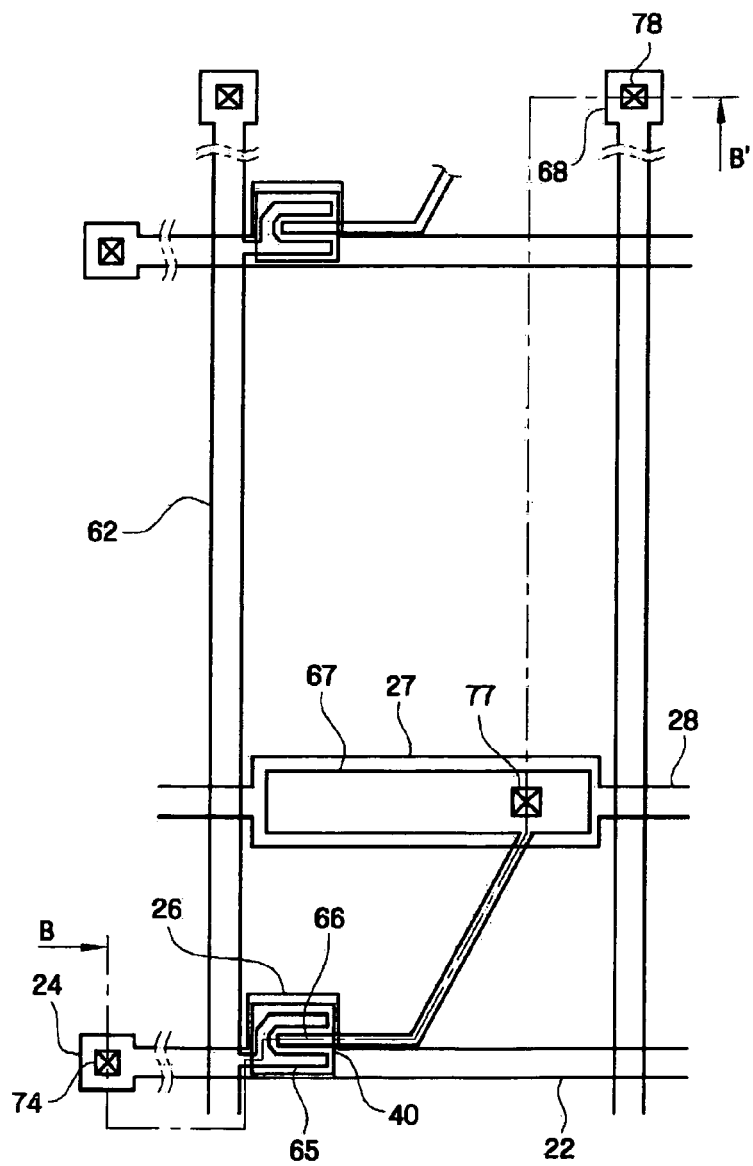
Figure 9B:
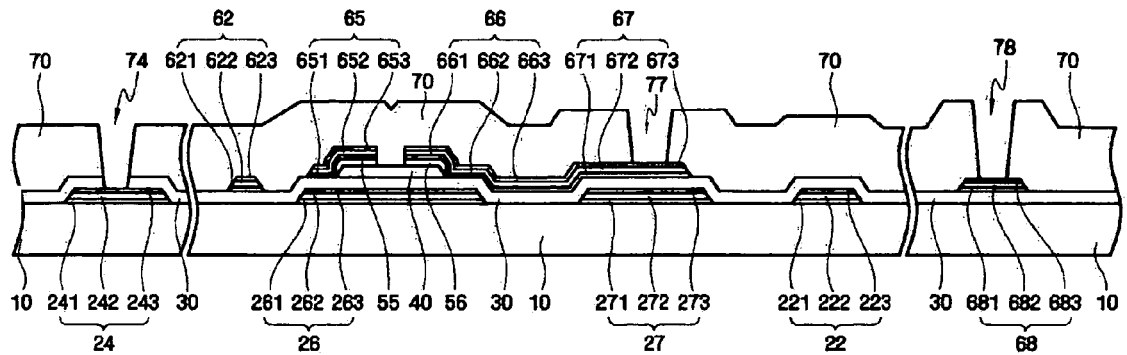

Next, as shown in FIGS. 9A and 9B, the passivation layer 70 is formed as a single layer or multiple layers including an organic material having superior planarization properties and photosensitivity. For example, passivation layer 70 can be formed of a-Si:C:O formed by PECVD, an insulating material having a low dielectric constant, such as a-Si:O:F, or an inorganic material such as SiNx.

Next, the gate insulating layer 30 and the passivation layer 70 are patterned by photolithography, thereby forming the contact holes 74, 77, and 78 that expose the gate end 24, the drain electrode extension protrusion 67, and the data end 68.

At this time, when the passivation layer 70 is an organic layer having photosensitivity, the contact holes 74, 77, and 78 may be formed only by photolithography. It is desirable to form the contact holes 74, 77, and 78 using an etchant and an etch process which has the same selectivity to the gate insulating layer 30 and the passivation layer 70.

Finally, as shown in FIGS. 5A and 5B, an ITO layer is deposited and photolithography is performed to form the pixel electrode 82 connected to the drain electrode 66 through the contact hole 77, form the auxiliary gate end 84 connected to the gate end 24 through the contact hole 74, and form the auxiliary data end 88 connected to the data end 68 through the contact hole 78.

Although a gate wire and a data wire are formed of a triple-layer structure including a lower conductive oxide layer, an Ag conductive layer, and an upper conductive oxide layer on a substrate in this embodiment of the present invention, only the gate wire or the data wire may be formed by a triple-layered structure. In addition, although a gate wire and a data wire are formed by a triple-layered structure including a lower conductive oxide layer, an Ag conductive layer, and an upper conductive oxide layer on a substrate, the conductive oxide layer may be a multi-layered conductive layer formed either under or on the Ag conductive layer.

A semiconductor layer and a data wire are formed through photolithography using different masks in the above description, but they can also be formed through photolithography using a single photoresist pattern as in the following description.

The structure of a unit pixel of a TFT substrate fabricated by a method for fabricating a TFT substrate according to another embodiment of the present invention will be described with reference to FIGS. 10A through 19B.

Figure 10A:
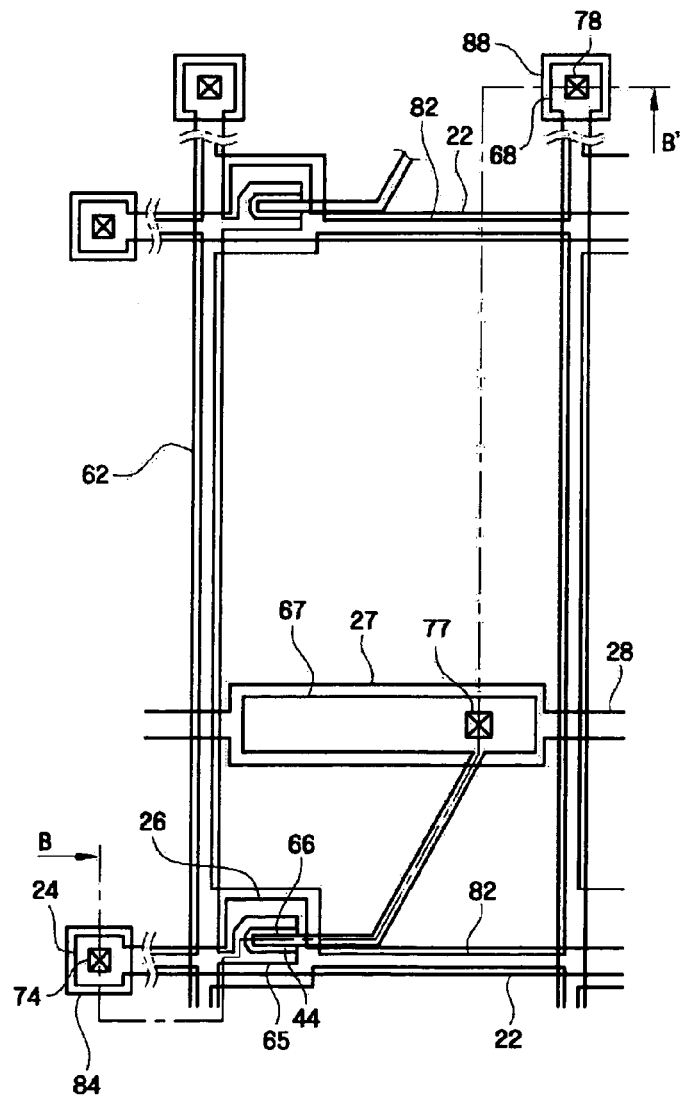
FIG. 10A is a layout illustrating a TFT substrate fabricated using a method for fabricating a TFT substrate according to another embodiment of the present invention.
Figure 10B:
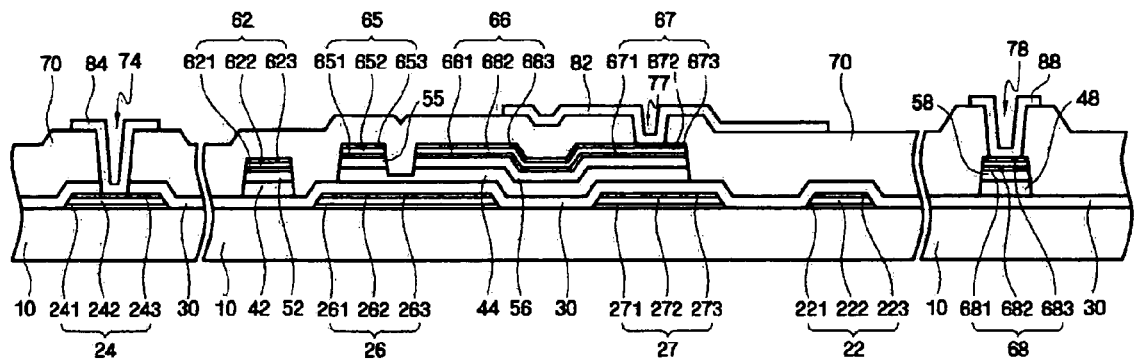
FIG. 10B is a cross-sectional view taken along a line B-B' of FIG. 10A.

FIG. 10A is a layout illustrating a TFT substrate fabricated using a method for fabricating a TFT substrate according to another embodiment of the present invention, and FIG. 10B is a cross-sectional view taken along a line B-B' of FIG. 10A.

In an embodiment of the present invention, a plurality of gate wires transmitting a gate signal are first formed on an insulating substrate 10. The gate wires include a gate line 22 that extends horizontally, as shown in FIG. 10A, a gate end 24 that is connected to the end of the gate line 22 to receive a gate signal from the outside and transmit the same to the gate line 22, a gate electrode 26 of a protruding TFT that is connected to the gate line 22, and a sustain electrode 27 and a sustain electrode line 28 formed parallel with the gate line 22. The sustain electrode line 28 extends horizontally in FIG. 10A across a pixel region and is connected to the sustain electrode 27 that is wider than the sustain electrode line 28. The sustain electrode 27, as shown in FIG. 10B, lies in part under a portion of, but is separated by dielectric 30, a portion of intrinsic silicon layer 44 and a portion of doped amorphous silicon layer 56, from a drain electrode extension portion 67 connected with a pixel electrode 82 to form a sustain electric condenser that improves electric charge retention capability of a pixel. The shapes and arrangements of the sustain electrode 27 and the sustain electrode line 28 may vary, and the sustain electrode 27 and the sustain electrode line 28 may not be formed when sustain capability generated by the overlap between the pixel electrode 82 and the gate line 22 is sufficiently high.

The gate wires 22, 24, 26, 27, and 28 are formed of triple layers including the lower conductive oxide layers 221, 241, 261, and 271 formed of ITO or IZO, the conductive layers 222, 242, 262, and 272 formed of Ag or an Ag-alloy, and the upper conductive oxide layers 223, 243, 263, and 273 formed of ITO or IZO as in the embodiment of the present invention shown in FIGS. 5A through 9B.

The gate insulating layer 30 is formed on the substrate 10 and the gate wires 22, 24, 26, 27, and 28.

Semiconductor patterns 42, 44, and 48 are formed on the gate insulating layer 30. Resistive contact layers 52, 55, 56, and 58 are formed on the semiconductor patterns 42, 44, and 48.

The data wires 62, 65, 66, 67, and 68 are formed on the resistive contact layers 52, 55, 56, and 58. The data wires include a data line 62 that is shown vertically in FIG. 10A and intersects the gate line 22 to define a pixel, a source electrode 65 that is a branch of the data line 62 and extends onto the resistive contact layer 55a data end 68 that is connected to an end of the data line 62 and receives an image signal from the outside, a drain electrode 66 that is separated from the source electrode 65 and is formed on the resistive contact layer 56 opposite to the source electrode 65 in view of (i.e. to overlie a portion of) the gate electrode 26 which defines a channel portion of a TFT, and a drain electrode extension portion 67 with a large area that extends from the drain electrode 66 and overlaps with the sustain electrode 27.

The data wires 62, 65, 66, 67, and 68 are formed of triple layers including the conductive layers 621, 651, 661, 671, and 681 formed of a conductive oxide material (hereinafter, referred to as "lower conductive oxide layers"), the conductive layers 622, 652, 662, 672, and 682 formed of Ag or an Ag-alloy (hereinafter, referred to as "Ag conductive layers"), and the conductive layers 623, 653, 663, 673, and 683 formed of a conductive oxide material (hereinafter, referred to as "upper conductive oxide layers").

The source electrode 65 has at least a portion that overlaps with a portion of layer 44 (formed by an earlier photolithographic step involving patterning and etching the semiconductor layer 40) and the drain electrode 66 is located in opposition to the source electrode 65 in view of (i.e. so as to overlie a portion of) the gate electrode 26 and has at least a portion that overlaps with a portion of semiconductor layer 44. Here, the resistive layers 55 and 56 exist between the semiconductor layer 44 and the source electrode 65 and between the semiconductor layer 44 and the drain electrode 66, respectively, to reduce contact resistances therebetween.

The drain electrode extension portion 67 overlaps with the sustain electrode 27 to form sustain capability between the sustain electrode 27 with the gate insulating layer 30 seerving as a dielectric between electrodes 27 and 67. When the sustain electrode 27 is not formed, the drain electrode extension portion 67 is not formed either.

The resistive contact layers 52, 55, 56, and 58 reduce contact resistances between the semiconductor patterns 42, 44, and 48 and the data wires 62, 65, 66, 67, and 68 and have the same shapes in plan view as the data wires 62, 65, 66, 67, and 68.

Meanwhile, the semiconductor patterns 42, 44, and 48 have the same shapes as those of the data wires 62, 65, 66, 67, and 68 and the resistive contact layers 52, 55, 56, and 58 except for a channel portion of a TFT. In other words, in the channel portion of the TFT, the source electrode 65 and the drain electrode 66 are separated and the resistive contact layer 55 under the source electrode 65 and the resistive contact layer 56 under the drain electrode 66 are separated. However, the semiconductor pattern 44 for the TFT is continuous in the channel portion of the TFT, thereby forming a channel of the TFT.

The passivation layer 70 is formed on the data wires 62, 65, 66, 67, and 68 and a portion of the semiconductor pattern 44 that is not covered by the data wires 62, 65, 66, 67, and 68. The passivation layer 70 may be formed of, for example, an organic material having superior planarization properties and photosensitivity, an insulating material having a low dielectric constant formed by plasma enhanced chemical vapor deposition (PECVD), such as a-Si:C:O or a-Si:O:F, or an inorganic material such as SiNx. When the passivation layer 70 is formed of an organic material, an insulating layer (not shown) formed of silicon nitride (SiNx) or silicon oxide (SiOx) or silicon dioxide ($SiO_2$) may be further formed under the passivation layer 70 to prevent the organic material of the passivation layer 70 from contacting a portion of the semiconductor layer 40 between the source electrode 65 and the drain electrode 66.

Contact holes 77 and 78 that expose the drain electrode extension portion 67 and the data line end 68, respectively, are formed in the passivation layer 70. A contact hole 74 is formed in the passivation layer 70 to expose a portion of the gate insulating layer 30.

A pixel electrode 82 that is electrically connected to the drain electrode 66 through the contact hole 77 and is located in a pixel is formed on the passivation layer 70. A data voltage applied to the pixel electrode 82 determines the arrangement of LC microspheres of a liquid crystal layer between the pixel electrode 82 and a common electrode of an upper display panel (not shown) by generating an electric field with the common electrode.

In addition, an auxiliary gate end 84 connected to the gate end 24 through the contact hole 74 and an auxiliary data end 88 connected to the data end 68 through the contact hole 78 are formed on the passivation layer 70. The pixel electrode 82, the auxiliary gate end 84, and the auxiliary data end 88 are formed of ITO.

Hereinafter, a method for fabricating a TFT substrate according to another embodiment of the present invention will be described with reference to FIGS. 10A and 10B and FIGS. 11A through 19B.

Figure 11A:
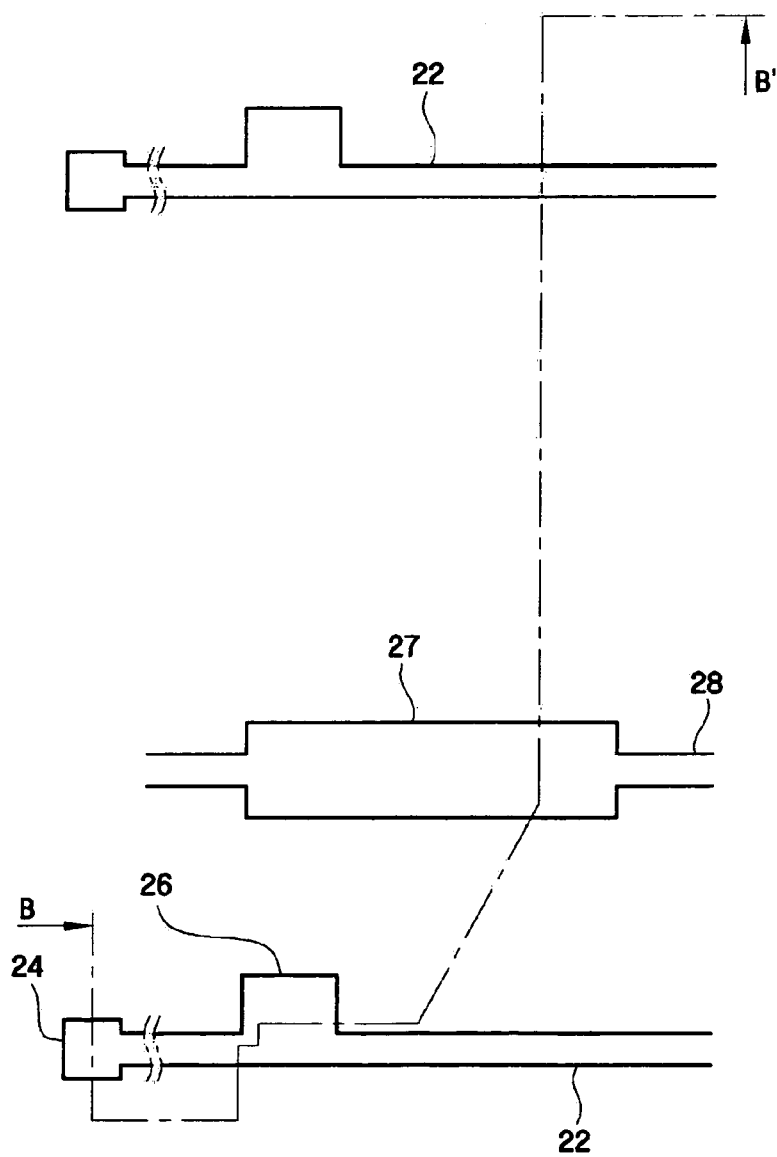
FIGS. 11A, 13A, and 19A are layouts sequentially illustrating a method for fabricating a TFT substrate according to another embodiment of the present invention.
Figure 11B:
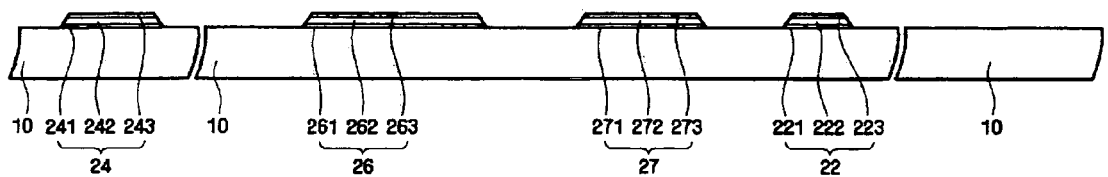
FIGS. 11B and 12 are cross-sectional views illustrating processing steps taken along a line B-B' of FIG. 11A.

First, as shown in FIGS. 11A and 11B, the gate triple layers 22, 24, 26, 27, and 28 are formed by sequentially depositing the lower conductive oxide layers 221, 241, 261, and 271 formed of a conductive oxide material such as ITO or IZO, the conductive layers 222, 242, 262, and 272 formed of Ag, and the upper conductive oxide layers 223, 243, 263, and 273 formed of a conductive oxide material such as ITO or IZO as in the embodiment of the present invention shown in FIGS. 5A through 9B.

Next, photolithography is performed on the gate triple layers 22, 24, 26, 27, and 28. The photolithography process is performed by wet etching using an etchant. The etchant is the same as that described with reference to FIGS. 1 through 4 and an explanation thereof will not be given.

Thus, as shown in FIGS. 11A and 11B, the gate wires including the gate line 22, the gate electrode 26, the gate end 24, the sustain electrode 27, and the sustain electrode line 28 are formed.

Figure 12:
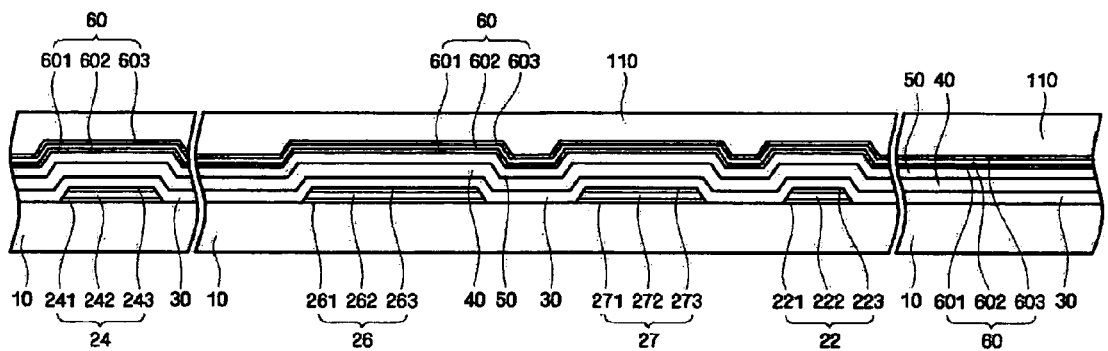
Figure 13A:
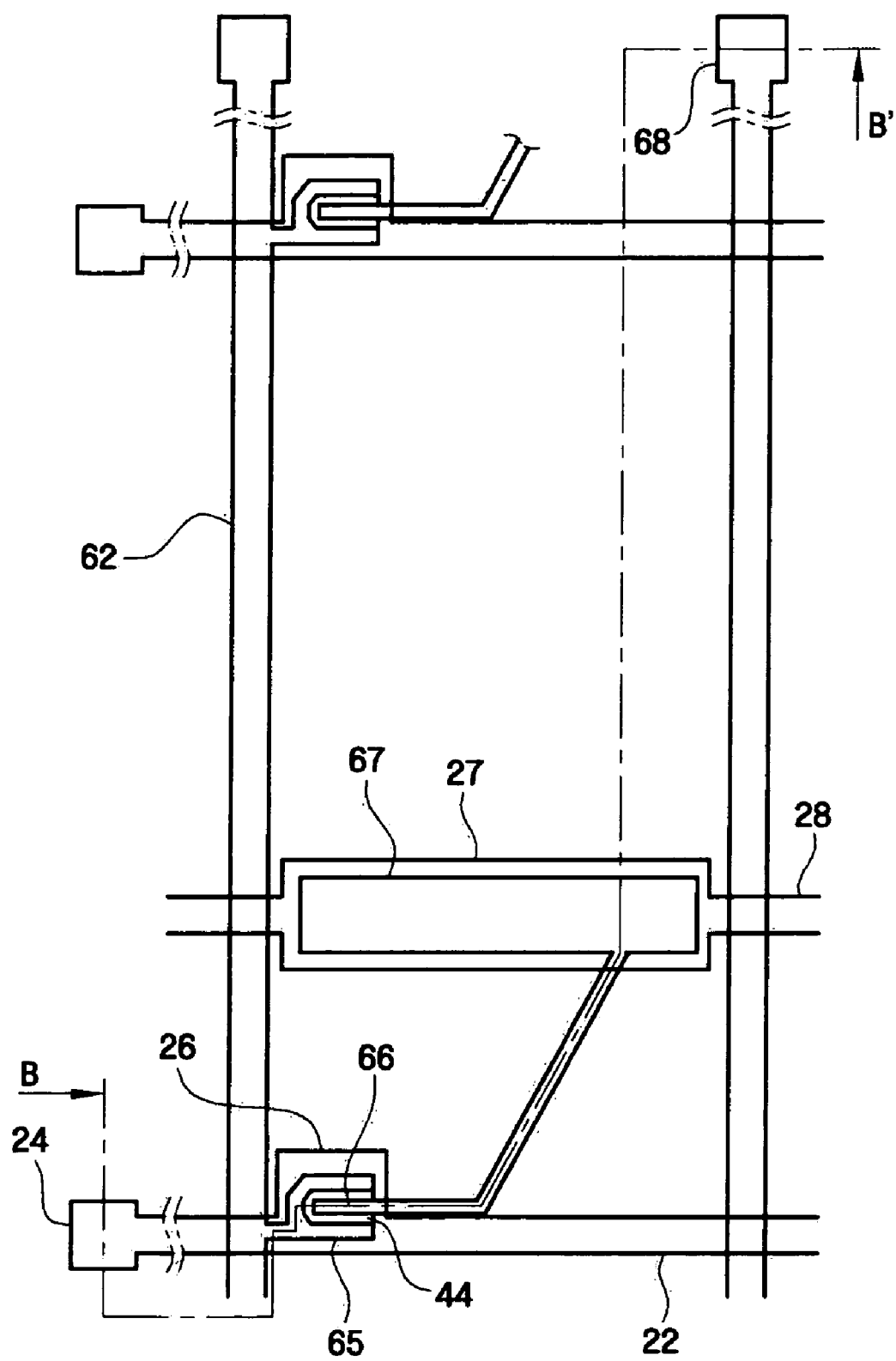
Figure 13B:
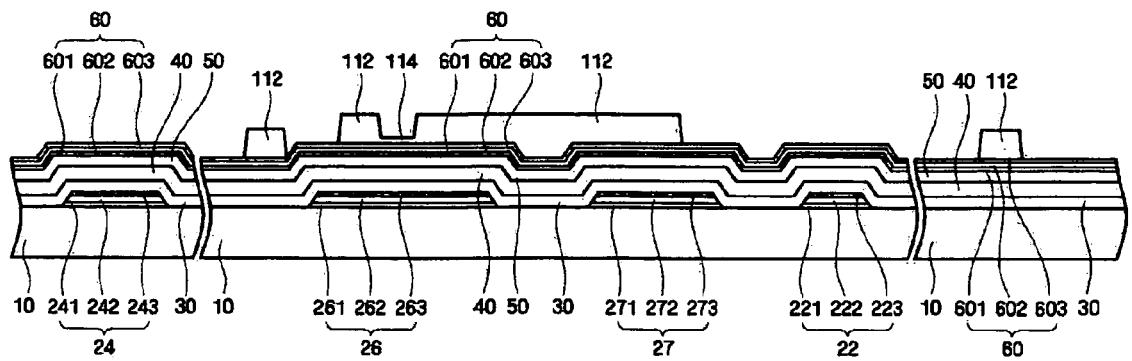

Next, as shown in FIG. 12, the gate insulating layer 30 formed of silicon nitride, an intrinsic amorphous silicon layer 40, and a doped amorphous silicon layer 50 are continuously deposited to thicknesses of, for example, 1500-5000 Å, 500-2000 Å, and 300-600 Å, respectively, using CVD. A data triple layer 60 in which a lower conductive oxide layer 601 formed of ITO, an Ag conductive layer 602 formed of Ag or an Ag-alloy, and an upper conductive oxide layer 603 formed of ITO are sequentially stacked is then formed on the doped amorphous silicon layer 50 using sputtering. Here, a deposition method for the data triple layer 60 is the same as that for the data triple layer in the embodiment of the present invention shown in FIGS. 5A through 9B.

A photoresist layer 110 is coated onto the data triple layer 60.

Referring to FIGS. 13A through 18, light is projected onto the photoresist layer 110 through a mask and development is performed. Thus, photoresist patterns 112 and 114 as shown in FIG. 13B are formed. At this time, in the photoresist patterns 112 and 114, a channel portion of the to-be-formed TFT, i.e., a first portion of amorphous silicon layer 40 beneath photoresist 114 (FIG. 13B) and between the to-be-formed source electrode 65 and the to-be-formed drain electrode 66 (FIGS. 16, 17 and 18) is covered by photoresist 114 which has a thickness that is smaller than that of the photoresist 112 over the data wire portion, i.e., a second portion of photoresist 112 that is located over a region in which a data wire is to be formed. The remaining portions of photoresist layer 110 (FIG. 12) except for the channel portion of photoresist 114 and the data wire portions of photoresist 112 are removed. At this time, the ratio of the thickness of the photoresist layer 114 remaining above the channel portion of the to-be-formed TFT transistor to the thickness of the photoresist layer 112 remaining over the data wire portions varies as a function of the etching process to be described later. It is preferable that the thickness of the first photoresist portion 114 be smaller than ½ of the thickness (approximately 8000 Å in one embodiment) of the second photoresist portion 112, e.g., smaller than 4000 Å. As such, the thickness of the photoresist layer 110 may vary with position in various ways. One way is to use well-known photolithographic techniques to vary the amount of light incident on various portions of photoresist layer 110. To adjust the amount of transmitted light, a slit or a lattice pattern is formed or a semi-transparent film is used as part of the mask used to pattern the photoresist layer 110.

At this time, it is preferable that the line width of a pattern between slits on a mask or an interval between patterns on a mask, i.e., the width of a slit, be smaller than the resolution of an exposure system. When a semi-transparent layer is used as a mask, a thin film having a transmissivity or thickness that is different from that of the semi-transparent layer may be used as part of the mask to control transmissivity of portions of the mask at the time of fabricating a mask.

Once light is projected onto the photoresist layer 110 through the mask, polymers in the photoresist layer 110 are completely decomposed in those portions that are directly exposed to light. However, polymers in the photoresist 110 beneath portions of the mask where a slit pattern or a semi-transparent layer is formed are not completely decomposed due to a small amount of light passed through the mask, and few polymers are decomposed in portions of photoresist 110 beneath a light-blocking layer of the mask. Once the photoresist layer 110 is developed, only portions of photoresist layer 110 where polymers are not decomposed remain and those portions of photoresist 110 to which a little light is projected have a thickness that is smaller than the thickness of those portions of photoresist 110 to which light is not projected. Photoresist portion 114 is a portion to which a little light is projected. At this time, since all the microspheres of polymer in the photoresist 110 may be decomposed if the exposure time is too long, the exposure time should be appropriately adjusted. The polymer material may be novolac resin and the exposure time, expressed as an energy, may be about 36 mmJ In one embodiment, the photoresist portion 114 having a smaller thickness than the photoresist portions 112 is formed by exposing a photoresist layer formed of a material capable of reflowing through a general mask divided into a portion the light can completely penetrate and a portion the light cannot penetrate at all, developing the photoresist layer, and making the photoresist layer reflow such that a portion of the photoresist layer 114 flows to a region where the photoresist layer 114 does not remain. The "reflow process" may be performed by heating the photoresist layer over the photoresist transition temperature and flowing the photoresist layer down to the channel portion. The photoresist pattern 114 and the data triple layer 60 including the upper conductive oxide layer 603, the Ag conductive layer 602, and the lower conductive oxide layer 601 are now etched using the etchant described above. Since the etching is substantially the same as the etching for, forming the data wires and the etching for forming the gate wires 22, 24, 26, 28, and 29 in the embodiment of the present invention shown in FIGS. 5A through 9B, an explanation thereof will not be given.

Figure 14:
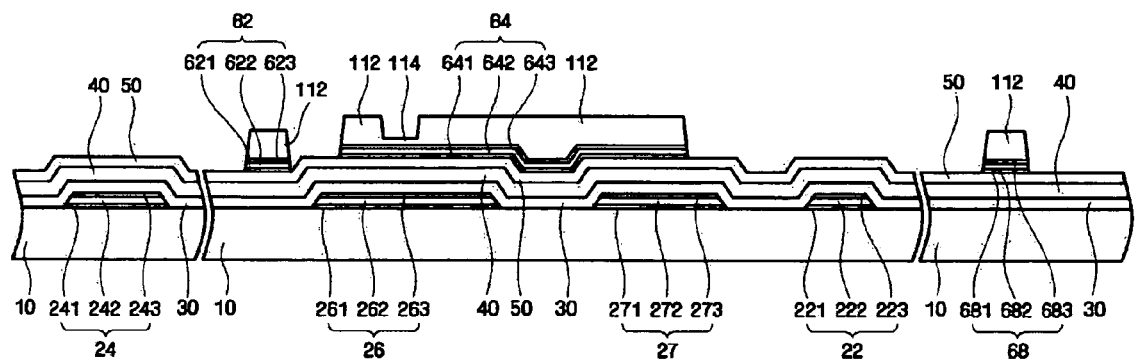

Thus, as shown in FIG. 14, only triple-layered patterns 64, of the to-be-formed channel portion and 62, and 68 of the data line portions remain. The other portions of the data triple layer 60 are entirely removed. As a result, the doped amorphous silicon layer 50 is exposed. The remaining triple-layered patterns 62, 64 and 68 are the same as the data wires (62, 65, 66, 67, and 68 of FIG. 5B) except that the source electrode 65 and the drain electrode 66 are not yet separated (i.e. defined) in FIGS. 14 and 15.

Figure 15:
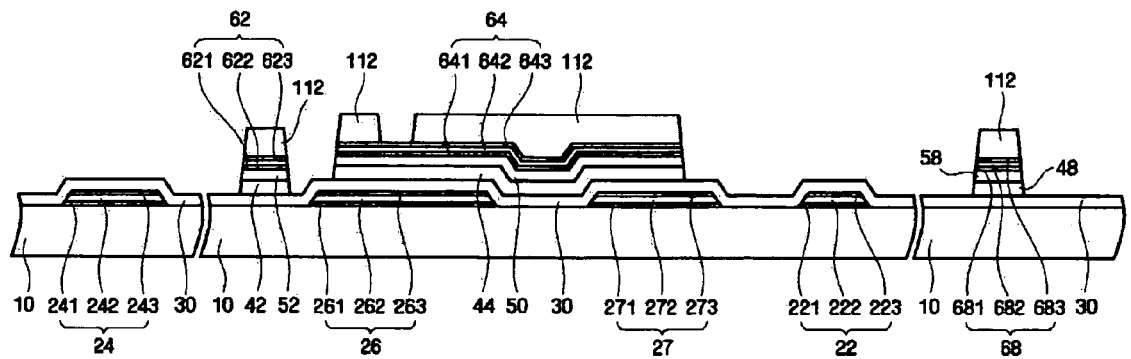

Next, as shown in FIG. 15, the exposed, doped amorphous silicon layer 50 and the intrinsic amorphous silicon layer 40 are dry etched to remove all portions of these layers except for the channel portion (layer 44 in FIG. 15) and the data wire portions (layers 42 and 48 in FIG. 15). Simultaneously, the first portion 114 of the photoresist layer is also removed by this dry etching. The result of this dry etching is shown in cross-sectional view in FIG. 15. This etching preferably is performed such that the photoresist patterns 112 and 114, the doped amorphous silicon layer 50, and the intrinsic amorphous silicon layer 40 are etched simultaneously but the gate insulating layer 30 is not etched. In particular, it is preferable that etching be performed on condition that the etch selectivities to the photoresist patterns 112 and 114 and the intrinsic amorphous silicon layer 40 are similar to each other. For example, two layers may be etched to similar thicknesses by using a mixed gas of $SF_6$ or HCl or a mixed gas of $SF_6$ or $O_2$. When the etch selectivities to the photoresist patterns 112 and 114 and the intrinsic amorphous silicon layer 40 are the same, the thickness of the first portion 114 is equal to or smaller than a total thickness of the intrinsic amorphous silicon layer 40 and the doped amorphous silicon layer 50. The dry etching is stopped at the appropriate time such that the dielectric layer 30 and the ITO layer 643 are not substantially etched by this dry etching step. In one embodiment, the mixed gas containing, for example, SF6 and HCL, is passed into the reaction chamber and a high frequency field is applied to the reaction chamber to induce glow discharge plasma. Dry etching is performed by colliding this plasma with the intrinsic amorphous silicon layer and the doped amorphous silicon layer. Thus, as shown in FIG. 15, a source/drain triple-layered pattern 64 is exposed after removal of the first portion 114 of the channel portion and the gate insulating layer 30 is exposed after removal of the doped amorphous silicon layer 50 and the intrinsic amorphous silicon layer 40 of the other portion. Since the second photoresist portion 112 covering the data wire portion is also etched, the thickness of photoresist portion 112 is reduced by at least the thickness of photoresist portion 114.

Residues of the photoresist layer 110 remaining on the surface of the source/drain triple-layered pattern 64 of the channel portion are removed through ashing.

Figure 16:
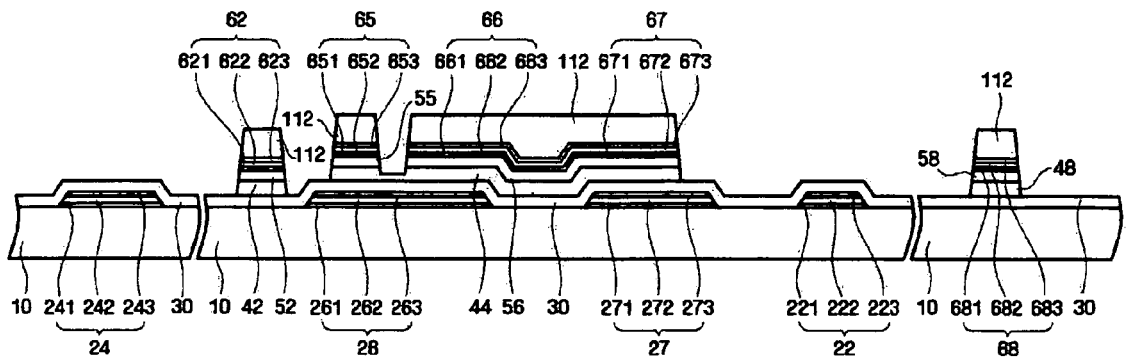

Next, as shown in FIG. 16, a portion of the triple-layered pattern 64 shown in FIG. 15 including portions of the upper conductive oxide layer 643 of the channel portion, the Ag conductive layer 642, and the lower conductive oxide layer 641 are removed through, for example, wet etching to expose the top surface of doped amorphous silicon layer 50. The same etchant as described above with reference to FIGS. 1 through 4 is used for this etching step. Therefore this etching step will not be described again.

The resistive contact layer formed of doped amorphous silicon 50 is etched. At this time, dry etching may be used. The etching gas may be a mixture of $CF_4$ and HCl or a mixture of $CF_4$ and $O_2$. When $CF_4$ and $O_2$ are used, a uniform thickness of the semiconductor pattern 44 formed of intrinsic amorphous silicon can remain. At this time, a portion of the semiconductor layer 44 is removed as shown in FIG. 16 and thus, the thickness of layer 44 may be reduced where it has been etched, as shown. The second portion 112 of the photoresist pattern may also be etched and thus the thickness of this photoresist 112 will be reduced. Etching should be performed so that the gate insulating layer 30 is not etched. The particular etching gas mixture described above in this paragraph may achieve this result. It is also preferable that the photoresist pattern 112 should be thick such that the data wires 62, 65, 66, 67, and 68 are not exposed after etching of the second portion 112.

Thus, the source electrode 65 and the drain electrode 66 are separated and defined, thereby completing the formation of the data wires 65 and 66 which make up these electrodes along with the resistive contact layers 55 and 56.

Figure 17:
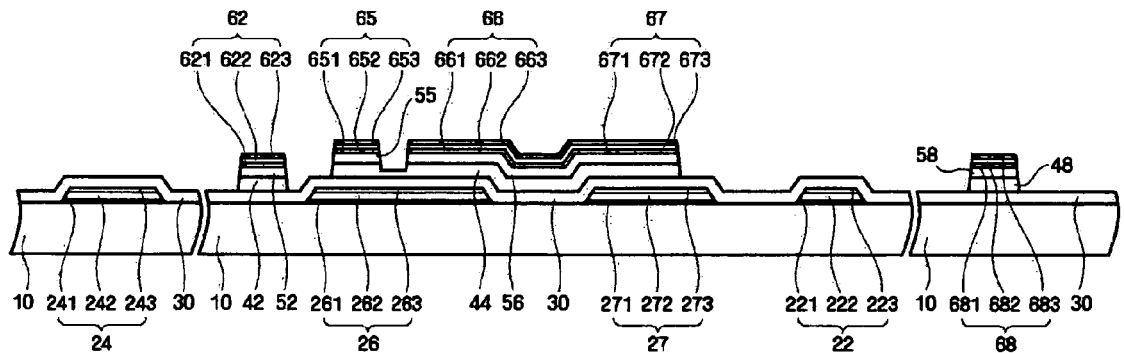

Next, as shown in FIG. 17, the second portion 112 of the photoresist layer remaining over the data wire portion of the structure is removed.

Figure 18:
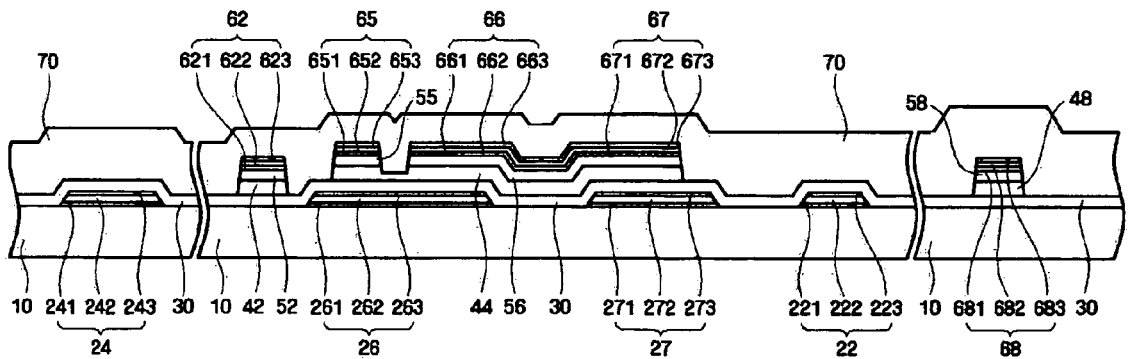
Figure 19A:
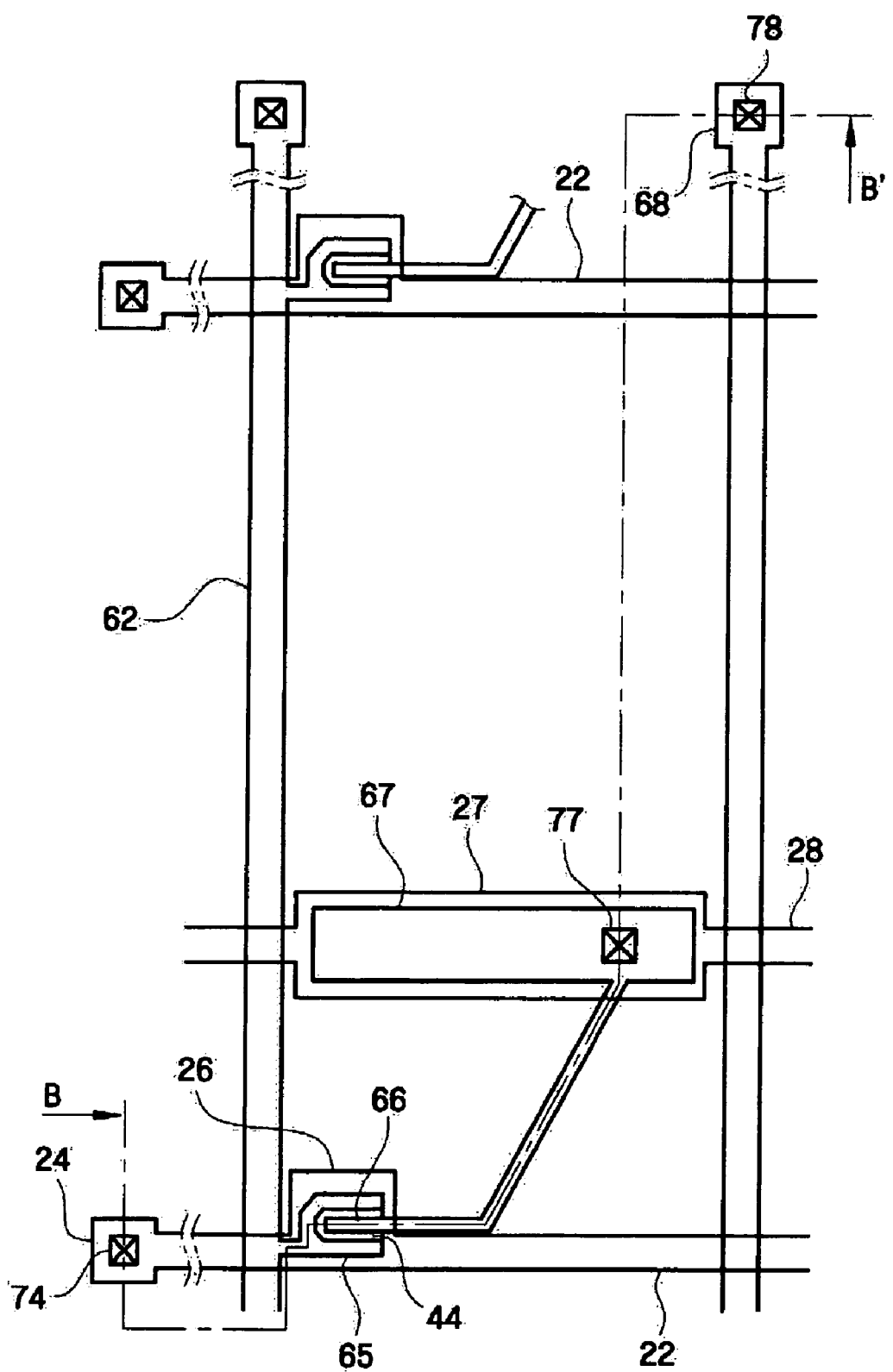
Figure 19B:
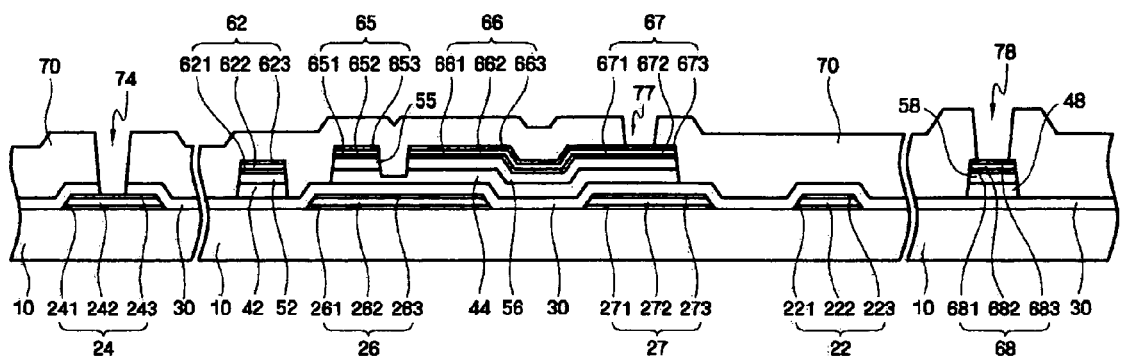
FIG. 19B is a cross-sectional view taken along a line B-B' of FIG. 19A.

Next, as shown in FIG. 18, the passivation layer 70 is formed over the top surface of the structure. Typically this layer is formed of silicon nitride. As shown in FIGS. 19A and 19B, photolithography is performed on the passivation layer 70 and the gate insulating layer 30, thereby forming the contact holes 77, 74 and 78 that expose the drain electrode extension portion 67, the gate end 24, and the data end 68.

Finally, as shown in FIGS. 10A and 10B, an ITO layer having a thickness of 400-500 Å is deposited and undergoes photolithography, thereby forming the pixel electrode 82 connected to the drain electrode extension portion 67, the auxiliary gate end 84 connected to the gate end 24 and the auxiliary data end 88 connected to the data end 68.

It is desirable to use a nitrogen gas for a pre-heating process prior to the deposition of ITO, so as to prevent a metal oxide layer from being formed on the metal layers 24, 67, and 68 that are exposed through the contact holes 74, 77, and 78.

In another embodiment of the present invention, an effect according to the embodiment of the present invention can be obtained, and the data wires 62, 65, 66, 67, and 68, the resistive contact layers 52, 55, 56, and 58, and the semiconductor patterns 42 and 48 are formed using a single mask, during which the source electrode 65 and the drain electrode 66 are separated and defined, thereby simplifying a fabrication process.

Although a triple layer including a lower conductive oxide layer, an Ag conductive layer, and an upper conductive oxide layer on a substrate is taken as an example in this embodiment of the present invention, only the gate wire or the data wire may have a triple-layered structure. In addition, although a gate wire and a data wire are formed by a triple-layered structure including a lower conductive oxide layer, an Ag conductive layer, and an upper conductive oxide layer on a substrate, the conductive oxide layer may be a multi-layered conductive layer formed either under or on the Ag conductive layer.

A method for fabricating a TFT substrate according to the present invention can be easily applied to an array on color filter (AOC) in which a TFT array is formed on a color filter.

As described above, by etching multiple-layers including conductive oxide layers under and/or on an Ag conductive layer using an etchant according to an embodiment of the present invention, adhesion to a structure under the multiple-layers is maintained and an electrically conductive wire having superior profile can be obtained. Moreover, by fabricating a TFT substrate having multiple-layers including conductive oxide layers under and/or on an Ag conductive layer using an etchant according to an embodiment of the present invention, adhesion of gate wires and data wires to a TFT substrate and profiles of the gate wires and the data wires are improved, thereby improving signal characteristics and image quality.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for fabricating a wire, the method comprising:
    forming multiple-layers including conductive oxide layers and an Ag conductive layer formed of Ag or an Ag-alloy on a substrate; and
    etching the multiple-layers using an etchant including a material having the formula 1, ammonium acetic acid, and the remainder of deionized water, wherein the formula 1 is expressed by:

    $$M(OH)_xL_y \qquad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

2. The method of claim 1, wherein the forming of the multiple-layers comprises sequentially depositing a first conductive oxide layer, the conductive layer formed of Ag or the Ag-alloy, and a second conductive oxide layer on the substrate.

3. The method of claim 1, wherein the amount of the material of formula 1 is in a range of 0.1-5 wt % and ammonium acetic acid is in a range 0.001-0.1 wt %.

4. The method of claim 1 or 3, further comprising phosphoric acid in a range of 60-70 wt %, nitric acid in a range of 0.5-5 wt %, and acetic acid in a range of 2-10 wt %.

5. The method of claim 1, wherein the substrate is formed of an insulator or a semiconductor.

6. The method of claim 1, wherein the etching is performed at a temperature of 30-50° C.

7. The method of claim 1, wherein the etching is performed using spraying.

8. The method of claim 1, wherein the etching is performed for 30-100 seconds.

9. The method of claim 1, wherein the etching is performed on the respective layers forming the multiple-layers in a batch manner.

10. The method of claim 1, wherein the conductive oxide layers are formed of indium tin oxide (ITO) or indium zinc oxide (IZO).

11. A method for fabricating a thin film transistor (TFT) substrate, the method comprising:
    forming gate multiple-layers to be formed into a gate including conductive oxide layers and a conductive layer formed of Ag or an Ag-alloy on a substrate;
    forming a gate wire by patterning the gate multiple-layers;
    forming a gate insulating layer and a semiconductor layer on the substrate and the gate wire;
    forming data multiple-layers including conductive oxide layers and a conductive layer formed of Ag or an Ag-alloy on the semiconductor layer; and
    forming a data wire by patterning the data multiple-layers;
    wherein the forming of the gate wire and/or the data wire comprises etching using an etchant including a material having the formula 1, ammonium acetic acid, and the remainder of deionized water, wherein the formula 1 is expressed by:

    $$M(OH)_xL_y \qquad (1)$$

where M indicates Zn, Sn, Cr, Al, Ba, Fe, Ti, Si, or B, X indicates 2 or 3, L indicates $H_2O$, $NH_3$, CN, COR, or $NH_2R$, Y indicates 0, 1, 2, or 3, and R indicates an alkyl group.

12. The method of claim 11, wherein the forming of the gate multiple-layers comprises sequentially depositing a first conductive oxide layer, the conductive layer formed of Ag or the Ag-alloy, and a second conductive oxide layer on the substrate.

13. The method of claim 11, wherein the forming of the data multiple-layers comprises sequentially depositing a first conductive oxide layer, the conductive layer formed of Ag or the Ag-alloy, and a second conductive oxide layer on the semiconductor layer.

14. The method of claim 11, wherein an amount of the material of formula 1 is in a range of 0.1-5 wt % and ammonium acetic acid is in a range 0.001-0.1 wt %.

15. The method of claim 11 or 14, further comprising phosphoric acid in a range of 60-70 wt %, nitric acid in a range of 0.5-5 wt %, and acetic acid in a range of 2-10 wt %.

16. The method of claim 11, wherein the etching is performed at a temperature of 30-50° C.

17. The method of claim 11, wherein the etching is performed using spraying.

18. The method of claim 11, wherein the etching is performed for 30-100 seconds.

19. The method of claim 11, wherein the etching is performed on the respective layers forming the gate multiple-layers and the data multiple-layers in a batch manner.

20. The method of claim 11, wherein the conductive oxide layers of the data multiple-layers and the gate multiple-layers are formed of indium tin oxide (ITO) or indium zinc oxide (IZO).

* * * * *